(12) United States Patent
Yu et al.

(10) Patent No.: US 8,187,928 B2
(45) Date of Patent: May 29, 2012

(54) METHODS OF FORMING INTEGRATED CIRCUITS

(75) Inventors: De-Wei Yu, Ping-tung (TW); Chun Hsiung Tsai, Xinpu Township (TW); Yu-Lien Huang, Jhubei (TW); Chien-Tai Chan, Hsinchu (TW); Wen-Sheh Huang, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

(21) Appl. No.: 12/886,713

(22) Filed: Sep. 21, 2010

(65) Prior Publication Data
US 2012/0070953 A1    Mar. 22, 2012

(51) Int. Cl.
*H01L 21/00* (2006.01)
*H01L 27/108* (2006.01)

(52) U.S. Cl. ........ 438/156; 438/164; 438/212; 257/302; 257/328; 257/E51.005

(58) Field of Classification Search .................. 438/156, 438/157, 163, 164, 212; 257/302, 308, 328, 257/401, E51.005
See application file for complete search history.

(56) References Cited

U.S. PATENT DOCUMENTS

| | | | |
|---|---|---|---|
| 5,581,202 A | 12/1996 | Yano et al. | |
| 5,658,417 A | 8/1997 | Watanabe et al. | |
| 6,065,481 A | 5/2000 | Fayfield et al. | |
| 6,299,724 B1 | 10/2001 | Fayfield et al. | |
| 6,503,794 B1 | 1/2003 | Matsuda et al. | |
| 6,613,634 B2 | 9/2003 | Ootsuka et al. | |
| 6,622,738 B2 | 9/2003 | Scovell | |
| 6,642,090 B1 | 11/2003 | Fried et al. | |
| 6,706,571 B1 | 3/2004 | Yu et al. | |
| 6,727,557 B2 | 4/2004 | Takao | |
| 6,740,247 B1 | 5/2004 | Han et al. | |
| 6,743,673 B2 | 6/2004 | Watanabe et al. | |
| 6,762,448 B1 | 7/2004 | Lin et al. | |
| 6,830,994 B2 * | 12/2004 | Mitsuki et al. | 438/486 |
| 6,858,478 B2 | 2/2005 | Chau et al. | |
| 6,872,647 B1 | 3/2005 | Yu et al. | |
| 6,964,832 B2 | 11/2005 | Moniwa et al. | |
| 7,009,273 B2 | 3/2006 | Inoh et al. | |

(Continued)

FOREIGN PATENT DOCUMENTS
WO     WO2007/115585     10/2007

OTHER PUBLICATIONS

Lenoble, Damien, "Plasma Doping as an Alternative Route for Ultra-Shallow Junction Integration to Standard CMOS Technologies", ST Microelectronics, Crolles Cedex, France, Semiconductor Fabtech, 16th Edition, FT16-19/2, pp. 1-5 (Jun. 2002).

(Continued)

*Primary Examiner* — Hsien Ming Lee
(74) *Attorney, Agent, or Firm* — Lowe Hauptman Ham & Berner, LLP (57) ABSTRACT

A method of forming an integrated circuit includes forming a gate structure over a substrate. A plasma doping (PLAD) process is performed to at least a portion of the substrate that is adjacent to the gate structure. The doped portion of the substrate is annealed in an ambient with an oxygen-containing chemical.

17 Claims, 8 Drawing Sheets

U.S. PATENT DOCUMENTS

| | | | |
|---|---|---|---|
| 7,084,079 B2 | 8/2006 | Conti et al. | |
| 7,084,506 B2 | 8/2006 | Takao | |
| 7,157,351 B2 | 1/2007 | Cheng et al. | |
| 7,190,050 B2 | 3/2007 | King et al. | |
| 7,247,887 B2 | 7/2007 | King et al. | |
| 7,265,008 B2 | 9/2007 | King et al. | |
| 7,315,994 B2 | 1/2008 | Aller et al. | |
| 7,323,375 B2 | 1/2008 | Yoon et al. | |
| 7,338,614 B2 | 3/2008 | Martin et al. | |
| 7,351,622 B2 * | 4/2008 | Buh et al. | 438/157 |
| 7,361,563 B2 | 4/2008 | Shin et al. | |
| 7,374,986 B2 * | 5/2008 | Kim et al. | 438/193 |
| 7,396,710 B2 | 7/2008 | Okuno | |
| 7,407,847 B2 | 8/2008 | Doyle et al. | |
| 7,425,740 B2 | 9/2008 | Liu et al. | |
| 7,494,862 B2 * | 2/2009 | Doyle et al. | 438/231 |
| 7,508,031 B2 | 3/2009 | Liu et al. | |
| 7,528,465 B2 | 5/2009 | King et al. | |
| 7,550,332 B2 | 6/2009 | Yang | |
| 7,605,449 B2 | 10/2009 | Liu et al. | |
| 7,685,911 B2 | 3/2010 | Jang et al. | |
| 7,798,332 B1 | 9/2010 | Brunet | |
| 7,851,865 B2 | 12/2010 | Anderson et al. | |
| 7,898,041 B2 | 3/2011 | Radosavljevic et al. | |
| 7,989,846 B2 | 8/2011 | Furuta | |
| 7,989,855 B2 | 8/2011 | Narihiro | |
| 8,003,466 B2 | 8/2011 | Shi et al. | |
| 8,043,920 B2 | 10/2011 | Chan et al. | |
| 2003/0080361 A1 | 5/2003 | Murthy et al. | |
| 2005/0153490 A1 | 7/2005 | Yoon et al. | |
| 2005/0280102 A1 | 12/2005 | Oh et al. | |
| 2006/0038230 A1 | 2/2006 | Ueno et al. | |
| 2006/0105557 A1 | 5/2006 | Klee et al. | |
| 2006/0214212 A1 | 9/2006 | Horita et al. | |
| 2006/0258156 A1 | 11/2006 | Kittl | |
| 2007/0015334 A1 | 1/2007 | Kittl et al. | |
| 2007/0020827 A1 * | 1/2007 | Buh et al. | 438/157 |
| 2007/0120156 A1 | 5/2007 | Liu et al. | |
| 2007/0122953 A1 | 5/2007 | Liu et al. | |
| 2007/0122954 A1 | 5/2007 | Liu et al. | |
| 2007/0128782 A1 | 6/2007 | Liu et al. | |
| 2007/0132053 A1 | 6/2007 | King et al. | |
| 2007/0145487 A1 | 6/2007 | Kavalieros et al. | |
| 2007/0152276 A1 | 7/2007 | Arnold et al. | |
| 2007/0178637 A1 | 8/2007 | Jung et al. | |
| 2008/0085580 A1 * | 4/2008 | Doyle et al. | 438/231 |
| 2008/0085590 A1 | 4/2008 | Yao et al. | |
| 2008/0095954 A1 | 4/2008 | Gabelnick et al. | |
| 2008/0124878 A1 | 5/2008 | Cook et al. | |
| 2008/0265344 A1 | 10/2008 | Mehrad et al. | |
| 2008/0290470 A1 | 11/2008 | King et al. | |
| 2008/0296632 A1 | 12/2008 | Moroz et al. | |
| 2009/0026540 A1 * | 1/2009 | Sasaki et al. | 257/344 |
| 2009/0181477 A1 | 7/2009 | King et al. | |
| 2009/0321836 A1 | 12/2009 | Wei et al. | |
| 2010/0187613 A1 | 7/2010 | Colombo et al. | |
| 2010/0207211 A1 * | 8/2010 | Sasaki et al. | 257/347 |
| 2011/0108920 A1 | 5/2011 | Basker et al. | |
| 2011/0195555 A1 | 8/2011 | Tsai et al. | |
| 2011/0256682 A1 | 10/2011 | Yu et al. | |

OTHER PUBLICATIONS

Chui, King-Jien, et al., "Source/Drain Germanium Condensation for P-Channel Strained Ultra-Thin Body Transistors", IEEE 2005, Silicon Nano Device Lab, Dept. of Electrical and Computer Engineering, National University of Singapore.

Shikida, Mitsuhiro, et al., "Comparison of Anisotropic Etching Properties Between KOH and TMAH Solutions", IEEE Xplore, Jun. 30, 2010, pp. 315-320.

Anathan, Hari, et al., "FinFet SRAM—Device and Circuit Design Considerations", Quality Electronic Design, 2004, Proceedings 5th International Symposium (2004); pp. 511-516.

Kedzierski, J., et al., "Extension and Source/Drain Design for High-Performance FinFET Devices", IEEE Transactions on Electron Devices, vol. 50, No. 4, Apr. 2003, pp. 952-958.

Liow, Tsung-Yang et al., "Strained N-Channel FinFETs with 25 nm Gate Length and Silicon-Carbon Source/Drain Regions for Performance Enhancement", VLSI Technology, 2006, Digest of Technical Papers, 2006 Symposium on VLSI Technology 2006; pp. 56-57.

* cited by examiner

METHODS OF FORMING INTEGRATED CIRCUITS

CROSS-REFERENCE TO RELATED APPLICATIONS

The present application is related to U.S. patent application Ser. Nos. 12/707,788, filed on Feb. 18, 2010, titled MEMORY POWER GATING CIRCUIT AND METHODS; 12/758,426, filed on Apr. 12, 2010, titled FINFETS AND METHODS FOR FORMING THE SAME; 12/731,325, filed on Mar. 25, 2010, titled ELECTRICAL FUSE AND RELATED APPLICATIONS; 12/724,556, filed on Mar. 16, 2010, titled ELECTRICAL ANTI-FUSE AND RELATED APPLICATIONS; 12/757,203, filed on Apr. 9, 2010, titled STI STRUCTURE AND METHOD OF FORMING BOTTOM VOID IN SAME; 12/797,839, filed on Jun. 10, 2010, titled FIN STRUCTURE FOR HIGH MOBILITY MULTIPLE-GATE TRANSISTOR; 12/831,842, filed on Jul. 7, 2010, titled METHOD FOR FORMING HIGH GERMANIUM CONCENTRATION SiGe STRESSOR; 12/761,686, filed on Apr. 16, 2010, titled FINFETS AND METHODS FOR FORMING THE SAME; 12/766,233, filed on Apr. 23, 2010, titled FIN FIELD EFFECT TRANSISTOR; 12/757,271, filed on Apr. 9, 2010, titled ACCUMULATION TYPE FINFET, CIRCUITS AND FABRICATION METHOD THEREOF; 12/694,846, filed on Jan. 27, 2010, titled INTEGRATED CIRCUITS AND METHODS FOR FORMING THE SAME; 12/638,958, filed on Dec. 14, 2009, titled METHOD OF CONTROLLING GATE THICKNESS IN FORMING FINFET DEVICES; 12/768,884, filed on Apr. 28, 2010, titled METHODS FOR DOPING FIN FIELD-EFFECT TRANSISTORS; 12/731,411, filed on Mar. 25, 2010, titled INTEGRATED CIRCUIT INCLUDING FINFETS AND METHODS FOR FORMING THE SAME; 12/775,006, filed on May 6, 2010, titled METHOD FOR FABRICATING A STRAINED STRUCTURE; 12/886,713, filed Sep. 21, 2010, titled METHOD OF FORMING INTEGRATED CIRCUITS; 12/941,509, filed Nov. 8, 2010, titled MECHANISMS FOR FORMING ULTRA SHALLOW JUNCTION; 12/900,626, filed Oct. 8, 2010, titled TRANSISTOR HAVING NOTCHED FIN STRUCTURE AND METHOD OF MAKING THE SAME; 12/903,712, filed Oct. 13, 2010, titled FINFET AND METHOD OF FABRICATING THE SAME; 61/412,846, filed Nov. 12, 2010, 61/394,418, filed Oct. 19, 2010, titled METHODS OF FORMING GATE DIELECTRIC MATERIAL and 61/405,858, filed Oct. 22, 2010, titled METHODS OF FORMING SEMICONDUCTOR DEVICES.

TECHNICAL FIELD

The present application relates generally to the field of semiconductor devices, and more particularly, to methods of forming integrated circuits.

BACKGROUND

The semiconductor integrated circuit (IC) industry has experienced rapid growth. Technological advances in IC materials and design have produced generations of ICs where each generation has smaller and more complex circuits than the previous generation. For example, the semiconductor industry ardently strives to decrease the size of memory cells. One strategy that has been employed includes the use of multiple gate transistors, otherwise known as Fin field effect transistors (FinFETs).

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

A conventional FinFET device is fabricated using a silicon fin raised from the semiconductor substrate. The channel of the device is formed in the fin, and a gate is provided over (e.g., surrounding) the fin—for example, in contact with the top and the sidewalls of the fin. The gate surrounding the channel (e.g., fin) is beneficial in that allows control of the channel from three sides. Source/drain regions are formed at two ends of the fin.

The current FinFET technology, however, has faced challenges. For example, ion implantation is typically used to form lightly doped drains (LDDs). Ion implantation creates a non-conformal doping profile in the fin (for example, heavier doping at the top of the fin than the bottom of the fin). This non-conformal doping profile may result in non-uniform turn-on voltages of FinFETs. Additionally, photo resist that is applied for the LDD ion implantation may further block the ion implantation.

It is understood that the following disclosure provides many different embodiments, or examples, for implementing different features of the application. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 1:
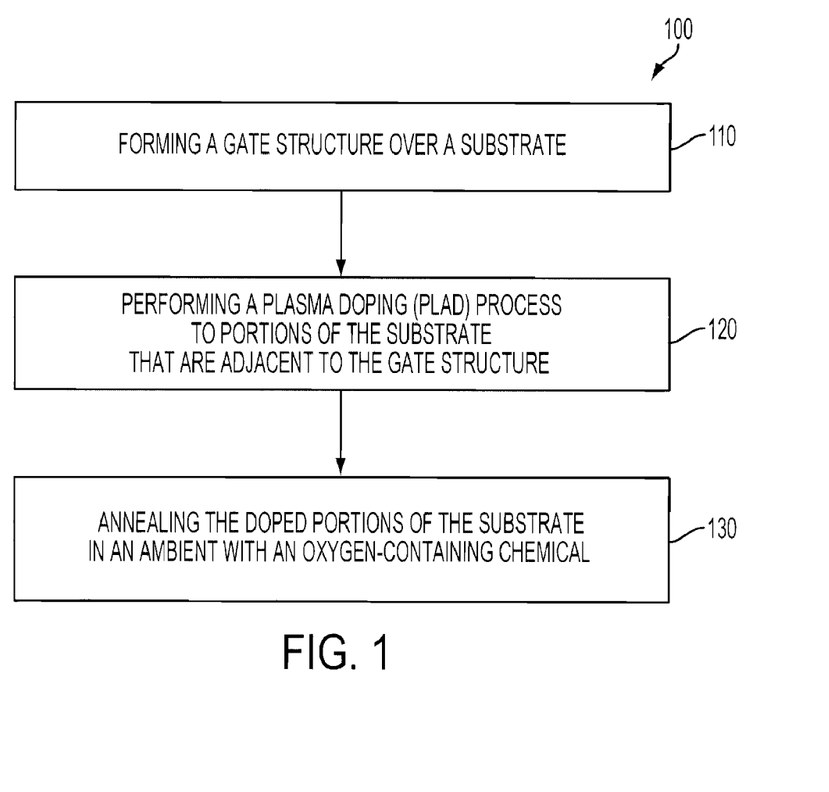
FIG. 1 is a flowchart illustrating an exemplary method of forming an integrated circuit according to an embodiment.

FIG. 1 is a flowchart illustrating an exemplary method of forming an integrated circuit according to an embodiment.

Figure 2A:
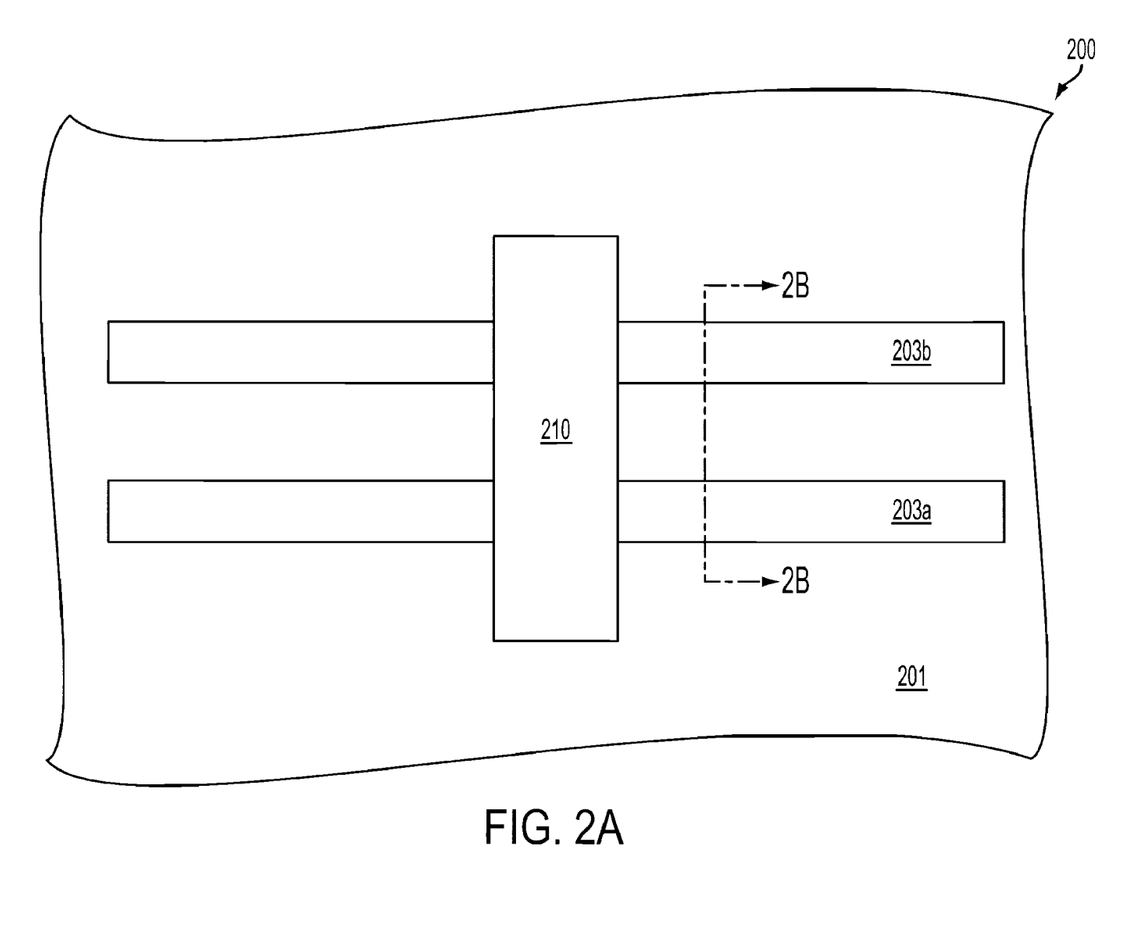
FIG. 2A is a schematic drawing illustrating an exemplary top view of at least one Fin field effect transistor (FinFET) over a substrate according to an embodiment.
Figure 2B:
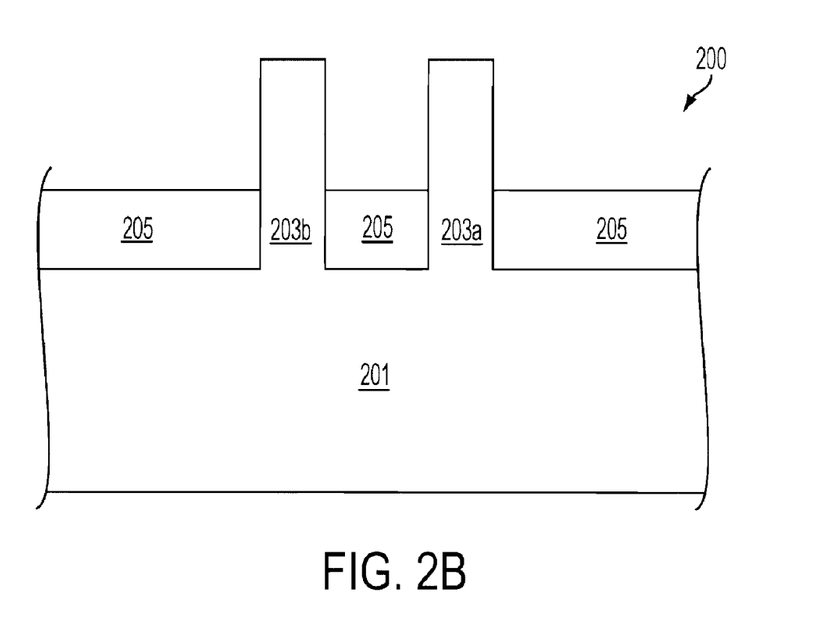
FIG. 2B-2D are schematic cross-sectional views of the FinFET during various fabrication stages taken along a section line 2B-2B.
Figure 2C:
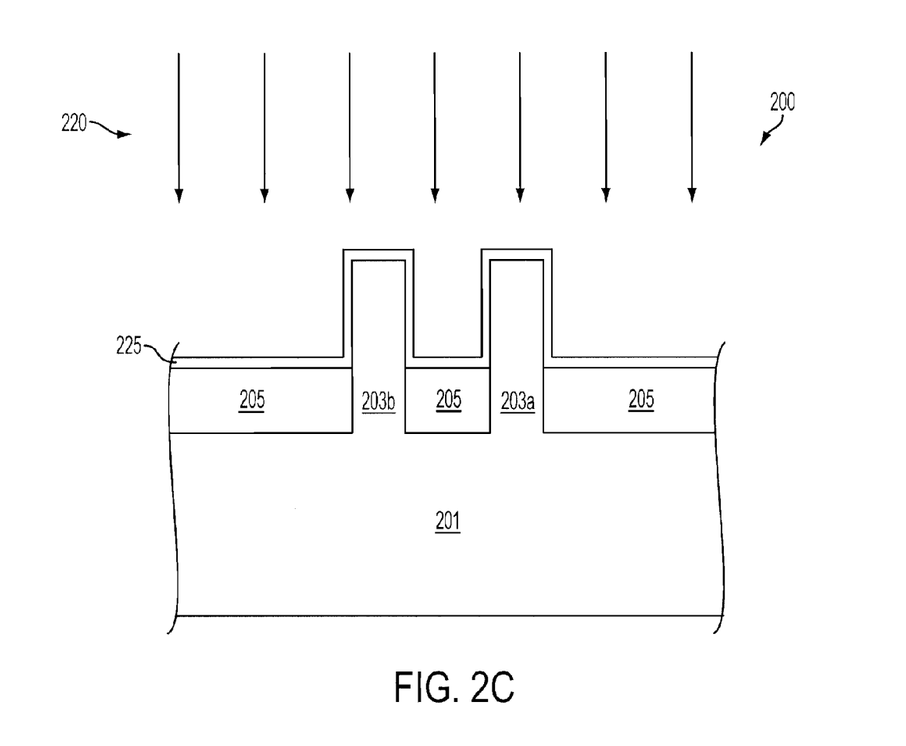
Figure 2D:
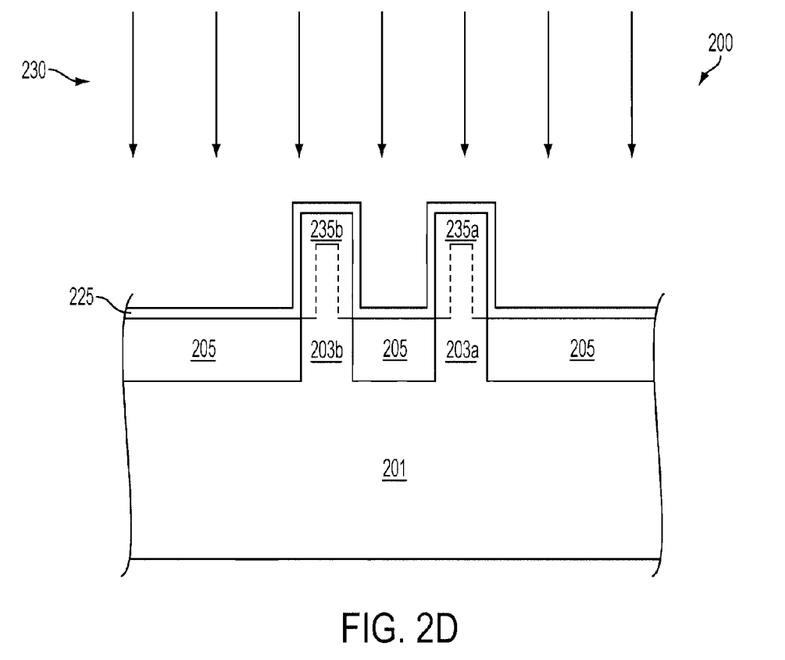

FIG. 2A is a schematic drawing illustrating an exemplary top view of at least one Fin field effect transistor (FinFET) over a substrate according to an embodiment. FIGS. 2B-2D are schematic cross-sectional views of the FinFET during various fabrication stages taken along section line 2B-2B. It is understood that FIGS. 1 and 2A-2D have been simplified for a better understanding of the concepts of the present disclosure. Accordingly, it should be noted that additional processes may be provided before, during, and/or after the method 100 of FIG. 1, and that some other processes may only be briefly described herein.

Referring now to FIG. 1, a method 100 of forming an integrated circuit 200 (shown in FIGS. 2A-2D) can include forming a gate structure over a substrate (block 110). The method 100 can include performing a plasma doping (PLAD) process to portions of the substrate that are adjacent to the gate structure (block 120). The method 100 can include annealing the doped portions of the substrate in an ambient with an oxygen-containing chemical (block 130). The integrated circuit 200 can be a digital circuit, an analog circuit, a mixed-signal circuit, a static random access memory (SRAM) circuit, an embedded SRAM circuit, dynamic random access memory (DRAM) circuit, an embedded DRAM circuit, a non-volatile memory circuit, e.g., FLASH, EPROM, $E^2$PROME, a field-programmable gate circuit, or any combinations thereof.

Referring now to FIGS. 2A-2D in conjunction with FIG. 1, an integrated circuit 200 can be fabricated in accordance with the method 100 of FIG. 1. In FIG. 1, the process of block 110 can form a gate structure over a substrate. For example, a gate structure 210 can be formed over a substrate 201. It is noted that FIGS. 2B-2D are cross-sectional views of a FinFET. The scope of the application is not limited thereto. In some embodiments, the method 100 can be used to form doped regions of a planar field effect transistor (FET).

In some embodiments, the substrate 201 can be a silicon substrate doped with a P-type dopant, such as boron (a P-type substrate). In some alternative embodiments, the substrate 201 could be another suitable semiconductor material. For example, the substrate 201 may be a silicon substrate that is doped with an N-type dopant, such as phosphorous or arsenic (an N-type substrate). The substrate 201 may alternatively be made of some other suitable elementary semiconductor, such as diamond or germanium; a suitable compound semiconductor, such as silicon carbide, silicon germanium, indium arsenide, or indium phosphide; or a suitable alloy semiconductor, such as silicon germanium carbide, gallium arsenic phosphide, or gallium indium phosphide. Further, the substrate 201 could include an epitaxial layer (epi layer), may be strained for performance enhancement, and may include a silicon-on-insulator (SOI) structure.

In some embodiments forming a FinFET, the substrate 201 can include at least one fin structure, e.g., fin structures 203a and 203b. The gate structure 210 can be disposed over the fin structures 203a and 203b. In some embodiments, the gate structure 210 can include a gate dielectric and a gate electrode (not shown). The gate dielectric can be a single layer or a multi-layer structure. In some embodiments for multi-layer structures, the gate dielectric can include an interfacial layer and a high dielectric constant (high-k) dielectric layer. The interfacial layer can include dielectric material such as, silicon oxide, silicon nitride, silicon oxinitride, other dielectric material, and/or the combinations thereof. The high-k dielectric layer can include high-k dielectric materials such as $HfO_2$, HfSiO, HfSiON, HfTaO, HfSiO, HfZrO, other suitable high-k dielectric materials, and/or combinations thereof. The high-k material may further be selected from metal oxides, metal nitrides, metal silicates, transition metal-oxides, transition metal-nitrides, transition metal-silicates, oxynitrides of metals, metal aluminates, zirconium silicate, zirconium aluminate, silicon oxide, silicon nitride, silicon oxynitride, zirconium oxide, titanium oxide, aluminum oxide, hafnium dioxide-alumina alloy, other suitable materials, and/or combinations thereof.

In some embodiments, the gate electrode can be disposed over the gate dielectric. The gate electrode can include poly-silicon, silicon-germanium, a metallic material including metal compounds such as, Al, Mo, Cu, W, Ti, Ta, TiN, TaN, NiSi, CoSi, other suitable conductive materials known in the art, or any combination thereof. In other embodiments, the gate electrode can include a polysilicon layer over a metallic layer. In still other embodiments, the gate electrode can include a work function metal layer that adjusts an N-metal work function or P-metal work function of a metal gate. P-type work function materials include compositions such as ruthenium, palladium, platinum, cobalt, nickel, conductive metal oxides, and/or other suitable materials. N-type metal materials include compositions such as hafnium, zirconium, titanium, tantalum, aluminum, metal carbides (e.g., hafnium carbide, zirconium carbide, titanium carbide, aluminum carbide), aluminides, and/or other suitable materials.

Referring to FIG. 2B, the fin structures 203a and 203b can extend from the substrate 201 and have the same material as the substrate 201. In some embodiments, shallow trench isolation (STI) features 205 can be formed around the fin structures 203a and 203b for electrical isolation. The STI features 205 can be formed by etching recesses (or trenches) in the substrate 201 and filling the recesses with a dielectric material. In some embodiments, the dielectric material of the STI features 205 can include silicon oxide. In some alternative embodiments, the dielectric material of the STI features 205 may include silicon nitride, silicon oxy-nitride, fluoride-doped silicate (FSG), and/or a low-k dielectric material known in the art.

In some embodiments, sidewalls and top surfaces of the fin structures 203a and 203b can undergo a surface cleaning process (not shown) to remove particulates and/or contaminants, which may include organic and/or metallic materials. The surface cleaning process may include a variety of applicable chemicals and techniques, and in one example may include the use of hydrofluoric acid, ammonium hydroxide, hydrogen peroxide, hydrochloric acid, sulfuric acid, and/or ozone. In some embodiments, the chemicals may be utilized in a wet dip or liquid, vapor and/or heated environment to clean the substrate surface. In other embodiments, standard RCA, SPM, SC1 (Standard Clean 1), and/or SC2 (Standard Clean 2) chemicals and processes may be used to clean the substrate surface.

Referring to FIG. 1, the process of block 120 can perform a plasma doping (PLAD) process to portions of the substrate that are adjacent to the gate structure. For example, a PLAD process 220 can be performed to portions of the substrate that are adjacent to the gate structure 210 as shown in FIG. 2C. In some embodiments forming a FinFET, the PLAD process 220 can be performed to portions of the fin structures 203a and 203b that are not covered by the gate structure 210. The PLAD process 220 can be performed for forming lightly-doped drains (LDD), pocket doped regions, source/drain (S/D) regions, and/or other doped regions that are formed adjacent to the gate structure 210 (shown in FIG. 2A).

Figure 3:
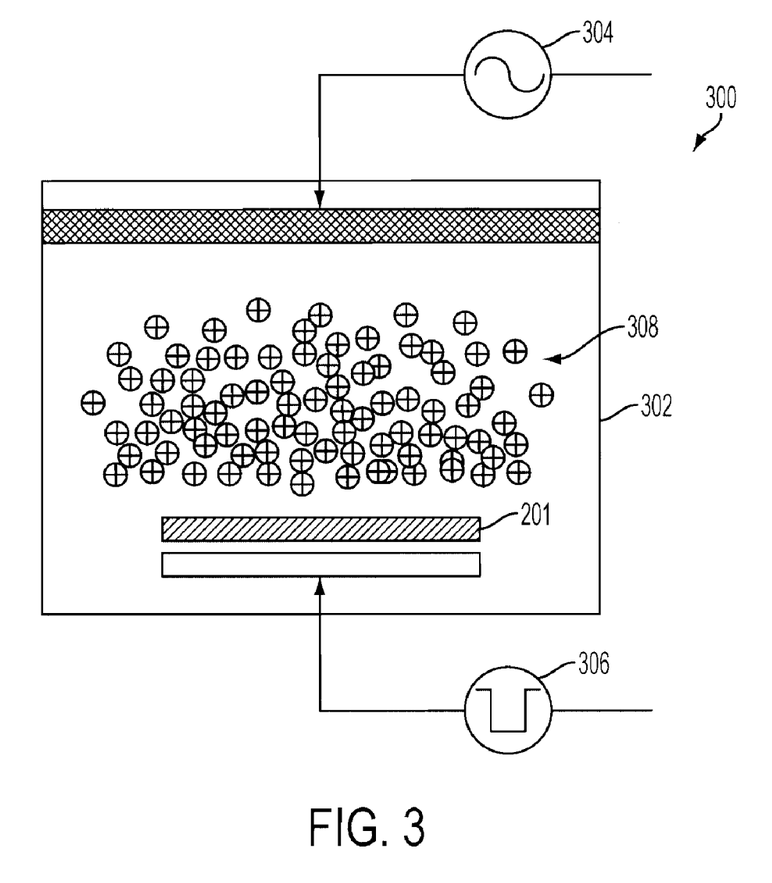
FIG. 3 is a schematic drawing illustrating an exemplary apparatus for a plasma doping (PLAD) process according to an embodiment.

In some embodiments forming LDDs, the PLAD process 220 can be performed in an apparatus 300 shown in FIG. 3. In some embodiments, the apparatus 300 can include a chamber 302, in which the substrate 201 is placed. The apparatus 300 can include power sources 304 and 306 that are electrically coupled with electrodes (not labeled) disposed in the chamber 302. In some embodiments, the power source 304 can be a radio frequency (RF) power source with a programmable pulse modulation function. The power source 306 can be a pulsed direct current (DC) or RF power source for providing a bias voltage on the substrate 201. In some embodiments, the power sources 304 and 306 can be operated independently from each other. Each of the power sources 304 and 306 can be programmed to be independently powered on and off without affecting the other.

Referring again to FIG. 2C, the PLAD process 220 can form a dopant-rich layer 225 over the STI features 205 and the fin structures 203a-203b. In some embodiments, the dopant-rich layer 225 can be referred to as an ion assisted deposition (IAD) layer. In some embodiments forming LDDs, the dopant-rich layer 225 can comprise a dopant that is used for forming the LDDs in the fin structures 203a and 203b. Depending on the conductivity type of the FinFET, in some embodiments, the dopant-rich layer 225 comprises n-type dopants (impurities) or p-type dopants (impurities). In some embodiments forming a P-type FinFET, the dopant-rich layer 225 can comprise boron, indium, and/or other group III elements. In other embodiments forming an N-type FinFET, the dopant-rich layer 225 can comprise phosphorous, arsenic, and/or other group V elements. In some embodiments, the atomic percentage of the dopant in the dopant-rich layer 225 may be substantially equal to or greater than about 90%. In other embodiments, the dopant-rich layer 225 can be a substantially pure dopant layer.

Referring again to FIG. 3, plasma 308 can be generated from a process gas in the chamber 302. The process gas can include at least one dopant gas such as $AsH_3$, $B_2H_6$, $PH_3$, $BF_3$, other dopant gases, and/or any combinations thereof, and at least one dilution gas such as Xe, Ar, He, Ne, $H_2$, other dilution gases, and/or any combinations thereof, depending on the desirable composition of dopant-rich layer 225. In some embodiments, the PLAD process 220 can have a bias voltage substantially equal to or less than about 1.5 KeV, a pressure substantially equal to or larger than about 6 mTorr, and an inductively coupled plasma (ICP) power ranging from about 250 Watt to about 1 KWatt.

In some embodiments, the profile of the dopant-rich layer 225 on the fin structures 203a-203b can be modified by changing the bias voltage. In some embodiments using a high bias voltage, e.g., about 1.5 KeV, the thickness of the dopant-rich layer 225 on the top surfaces of the fin structures 203a-203b is larger than that on the sidewalls of the fin structures 203a-203b. In other embodiments using a low bias voltage, e.g., substantially equal to or less than about 0.5 KeV, the thickness of the dopant-rich layer 225 on the top surfaces of the fin structures 203a-203b can be substantially equal to that on the sidewalls of the fin structures 203a-203b. In still other embodiments using a bias voltage of about 0.2 KeV, the dopant-rich layer 225 can be substantially conformal over the fin structures 203a-203b.

Referring again to FIG. 1, the process of block 130 can anneal the doped portions of the substrate in an ambient with an oxygen-containing chemical. For example, an annealing process 230 can anneal the portions of the fin structures 203a and 203b that are covered by the dopant-rich layer 225. In some embodiments, the annealing process 230 can drive dopants from the dopant-rich layer 225 into the fin structures 203a and 203b, forming doped regions 235a and 235b therein, respectively.

In some embodiments, the annealing process 230 can include a rapid thermal annealing (RTA) process. The oxygen-containing chemical can include at least one of oxygen ($O_2$), ozone ($O_3$), dihydrogen oxide ($H_2O$), hydrogen peroxide ($H_2O_2$), other oxygen-containing chemical, and/or any combinations thereof. The oxygen-containing chemical can be in a vapor phase, a gaseous phase, a plasma phase, other phases, or any combinations thereof. In some embodiments using gaseous oxygen, the oxygen can have a volume percentage substantially equal to or larger than 2%. In other embodiments, the oxygen can have a volume percentage ranging from about 2% to about 10%. In still other embodiments, the oxygen can have a volume percentage ranging from about 2% to about 4%.

It is found that the oxygen-containing chemical can interact with dopants of the doped-rich layer 225 to form oxidized material on the surface of the doped-rich layer 225 during the annealing process 230. The oxidized material, e.g., arsenic oxide, can substantially reduce vaporization and/or out-diffusion of arsenic from the doped-rich layer 225. In some embodiments, the annealing process 230 can vaporize the oxidized material. By forming the oxidized material, the dopants of the dopant-rich layer 225 can be desirably driven into the fin structures 203a and 203b. It is also found that the amount of the oxidized material can be controlled such that a subsequent strain structure, e.g., silicon and/or silicon germanium, for stressing the channel of the transistor can be desirably and substantially uniformly formed on the material annealed with the oxygen-containing chemical.

As noted, the profile of the dopant-rich layer 225 on the fin structures 203a-203b can be modified by changing the bias voltage. If a high bias voltage, e.g., 1.5 KeV, is applied, the thickness of the dopant-rich layer 225 on the top surfaces of the fin structures 203a-203b is larger than that on the sidewalls of the fin structures 203a-203b. After the annealing process 230, the dopants may be substantially doped in the whole portions of the fin structures 203a and 203b that are above the surface of the STI features 205.

Figure 4A:
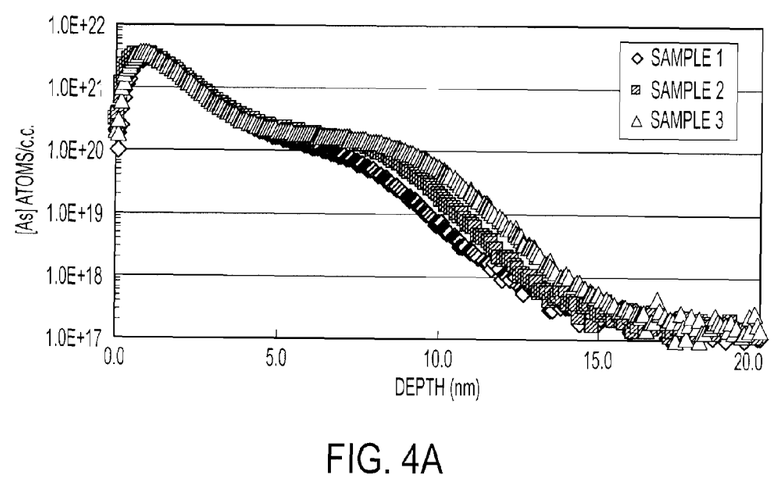
FIG. 4A is a schematic drawing illustrating secondary ion mass spectrometry (SIMS) results from samples formed by a bias voltage larger than about 1.0 KeV according to an embodiment.

FIG. 4A is a schematic drawing illustrating secondary ion mass spectrometry (SIMS) results from samples formed by a bias voltage larger than about 1.0 KeV. In FIG. 4A, the vertical axis represents the dopant concentration of As and the horizontal axis represents the depth into the fin structure which the dopants are driven. Samples 1-3 each have a 20-nm (nanometer) fin width and have a dopant-rich layer formed by a 1.5-KeV bias voltage. The deposition times of the dopant-rich layers of the samples 1-3 are 20 seconds, 60 seconds, and 60 seconds, respectively. The samples 1-3 are subjected to annealing processes without oxygen and having annealing temperatures 1010° C., 1010° C., and 1030° C., respectively. Assumed that pocket regions of the samples 1-3 each having a dopant concentration of about $5.0E+18$ $cm^{-3}$, the junction depths of the samples 1-3 are about 10.4 nm, 11.3 nm, and 12.4 nm, respectively. Since the fin width of each sample is about 20 nm, the dopants driven into each sidewall of the fin structure can make the fin structures above the STI features substantially completely doped.

Also noted, if a low bias voltage, e.g., 0.2 KeV, is applied, the dopant-rich layer 225 can be substantially conformal over the fin structures 203a-203b. After the annealing process 230, the doped regions 235a and 235b (shown in FIG. 2D) can be substantially conformally formed into the fin structure 203a and 203b, respectively.

Figure 4B:
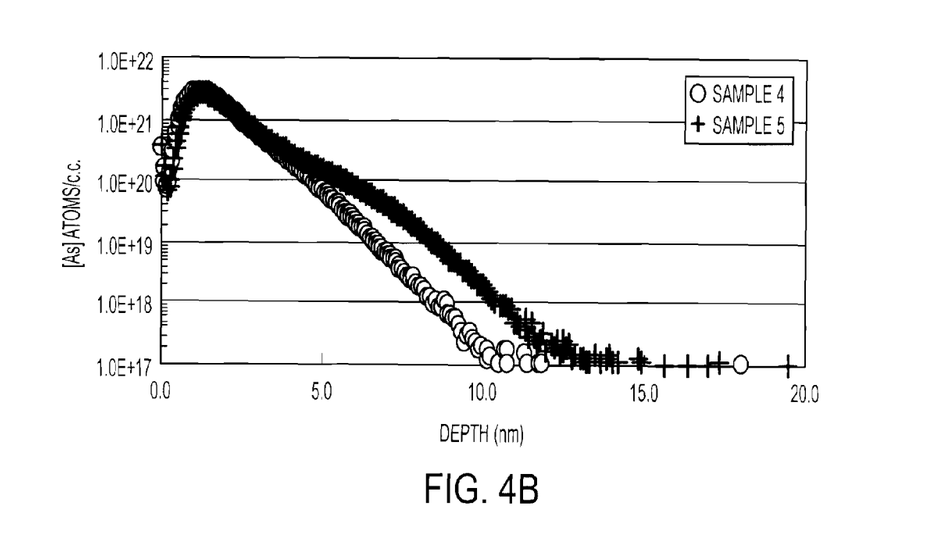
FIG. 4B is a schematic drawing illustrating secondary ion mass spectrometry (SIMS) results from samples formed by a bias voltage less than about 0.5 KeV according to an embodiment.

FIG. 4B is a schematic drawing illustrating secondary ion mass spectrometry (SIMS) results from samples formed by a bias voltage less than about 0.5 KeV. In FIG. 4B, samples 4-5 each have a 20-nm (nanometer) fin width and have a dopant-rich layer formed by a 0.2-KeV bias voltage. The samples 4-5 have the same deposition conditions except the annealing temperatures 1010° C. and 1050° C., respectively. The samples 4-5 both are subjected to annealing processes with 4% oxygen. With the same assumption that pocket regions of the samples 4-5 each have a dopant concentration of about 5.0E+18 $cm^{-3}$, the junction depths of the samples 4-5 are about 7.3 nm and 9.1 nm, respectively. Since the fin width of each sample is about 20 nm, the dopants can be substantially conformally driven into the top and sidewalls of the fin structure. It is noted that the driven depth of the LDD dopants for the low bias voltage samples is shallower. The shallow dopant depth can ease the concern of the short-channel effect resulting from the over-driven LDD dopants under the gate structure.

As noted, FIGS. 1 and 2A-2D have been simplified and additional processes may be provided before, during, and/or after the method 100 of FIG. 1. In some embodiments, the method 100 can optionally include a process (not shown) for striping the dopant-rich layer 225 (shown in FIG. 2D). In some embodiments removing an arsenic-rich layer, the striping process can use a sulfuric acid ($H_2SO_4$) solution. In other embodiments, the striping process can be saved due to concerns of processing time, processing costs, and/or collapses of fin structures during the striping process.

In some embodiments, the method 100 can be free from including forming a cap layer directly contacting the dopant-rich layer 225. The cap layer can be formed to prevent vaporization and/or out-diffusions of arsenic dopants from the dopant-rich layer 225. The saving of the cap layer can reduce the processing time and/or processing costs of forming the cap layer. Additionally, a striping process that is dedicated to removing the cap layer can also be saved. It is found that the striping process may damage surfaces of the fin structure while removing the cap layer. By saving the striping process, the processing time, the processing costs, and/or the surface damage resulting from the striping process can be eased.

In at least one embodiment, a method of forming an integrated circuit includes forming a gate structure over a substrate. A plasma doping (PLAD) process is performed to portions of the substrate that are adjacent to the gate structure. The doped portions of the substrate are annealed in an ambient with an oxygen-containing chemical.

In another embodiment, a method of forming a Fin field effect transistor (FinFET) includes forming a gate structure over at least one fin structure of a substrate. A plasma doping (PLAD) process is performed to portions of the at least one fin structure that are adjacent to the gate structure so as to form a dopant-rich layer over the portions of the at least one fin structure. The doped portions of the at least one fin structure are annealed in an ambient with an oxygen-containing chemical so as to form lightly doped drains (LDDs) of the FinFET.

In yet another embodiment, a method of forming a Fin field effect transistor (FinFET) includes forming a gate structure over at least one fin structure of a substrate. A plasma doping (PLAD) process is performed to portions of the at least one fin structure that are adjacent to the gate structure so as to form a dopant-rich layer over the portions of the at least one fin structure. The PLAD process has a bias voltage substantially equal to or less than about 0.5 KeV, such that the dopant-rich layer is substantially conformally deposited on the portions of the at least one fin structure. The doped portions of the at least one fin structure are annealed in an ambient with oxygen having a volume percentage ranging from about 2% to about 10% so as to form lightly doped drains (LDDs) of the FinFET.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming an integrated circuit, the method comprising:
    forming a gate structure over a substrate;
    performing, after the formation of the gate structure, a plasma doping (PLAD) process to at least a portion of the substrate that is adjacent to the gate structure so as to form a doped portion of the substrate; and
    annealing the doped portion of the substrate in an ambient with an oxygen-containing chemical to cause the oxygen-containing chemical interacting with dopants of the doped portion to form oxidized material on a surface of the doped portion,
    an amount of the oxidized material being controlled such that a subsequent strain structure is capable of being substantially uniformly formed on the oxidized material.

2. The method of claim 1, wherein annealing the doped portion of the substrate comprises rapid thermal annealing (RTA) the doped portion of the substrate, and the oxygen-containing chemical includes at least one of oxygen ($O_2$), ozone ($O_3$), hydrogen dioxide ($H_2O$), and hydrogen peroxide ($H_2O_2$).

3. The method claim 2, wherein the oxygen-containing chemical in the ambient has a volume percentage substantially equal to or larger than about 2%.

4. The method claim 2, wherein the oxygen-containing chemical in the ambient has a volume percentage ranging from about 2% to about 10%.

5. The method of claim 1, wherein the substrate comprises at least one fin structure, the gate structure is disposed over the at least one fin structure, and performing the plasma doping (PLAD) process comprises:
    performing the plasma doping (PLAD) process to a portion of the at least one fin structure that is not covered by the gate structure so as to form lightly doped drains (LDDs) in the at least one fin structure.

6. The method of claim 5, wherein the plasma doping (PLAD) process has a bias voltage substantially equal to or less than about 0.5 KeV, such that a dopant-rich layer is substantially conformally deposited on the portions of the at least one fin structure.

7. The method of claim 6, wherein the bias voltage is about 0.2 KeV.

8. The method of claim 6, wherein the method is free from including a cap layer directly covering the dopant-rich layer, and the cap layer is configured to prevent vaporization of dopants from the dopant-rich layer during the annealing process.

9. A method of forming a Fin field effect transistor (FinFET), the method comprising:
    forming a gate structure over at least one fin structure of a substrate;
    performing, after the formation of the gate structure, a plasma doping (PLAD) process to a portion of the at least one fin structure that are adjacent to the gate structure so as to form a dopant-rich layer over the portion of the at least one fin structure; and annealing the dopant-rich layer in an ambient with an oxygen-containing chemical so as to form lightly doped drains (LDDs) of the FinFET and to cause the oxygen-containing chemical interacting with dopants of the dopant-rich layer to form oxidized material on a surface of the dopant-rich layer, an amount of the oxidized material being controlled such that a subsequent strain structure is capable of being substantially uniformly formed on the oxidized material.

10. The method of claim 9, wherein annealing the doped portion of the at least one fin structure comprises rapid thermal annealing (RTA) the doped portions of the at least one fin structure, and the oxygen-containing chemical includes at least one of oxygen ($O_2$), ozone ($O_3$), hydrogen dioxide ($H_2O$), and hydrogen peroxide ($H_2O_2$).

11. The method claim 10, wherein the oxygen-containing chemical in the ambient has a volume percentage substantially equal to or larger than about 2%.

12. The method claim 10, wherein the oxygen-containing chemical in the ambient has a volume percentage ranging from about 2% to about 10%.

13. The method of claim 9, wherein the plasma doping (PLAD) process has a bias voltage substantially equal to or less than about 0.5 KeV, such that the dopant-rich layer is substantially conformally deposited on the portions of the at least one fin structure.

14. The method of claim 13, wherein the bias voltage is about 0.2 KeV.

15. The method of claim 13, wherein the method is free from including a cap layer directly covering the dopant-rich layer, and the cap layer is configured to prevent vaporization of dopants from the dopant-rich layer during the annealing process.

16. A method of forming a Fin field effect transistor (FinFET), the method comprising:

forming a gate structure over at least one fin structure of a substrate;

performing, after the formation of the gate structure, a plasma doping (PLAD) process to a portion of the at least one fin structure that are adjacent to the gate structure so as to form a dopant-rich layer over the portion of the at least one fin structure, wherein the PLAD process has a bias voltage substantially equal to or less than about 0.5 KeV, such that the dopant-rich layer is substantially conformally deposited on the portions of the at least one fin structure; and annealing the dopant-rich layer in an ambient with oxygen having a volume percentage ranging from about 2% to about 10% so as to form lightly doped drains (LDDs) of the FinFET and to cause the oxygen-containing chemical interacting with dopants of the dopant-rich layer to form oxidized material on a surface of the dopant-rich layer, an amount of the oxidized material being controlled such that a subsequent strain structure is capable of being substantially uniformly formed on the oxidized material.

17. The method of claim 16, wherein the method is free from including a cap layer directly covering the dopant-rich layer, and the cap layer is configured to prevent vaporization of dopants from the dopant-rich layer during the annealing process.

* * * * *